United States Patent [19]
Matsumoto

[11] Patent Number: 5,815,029
[45] Date of Patent: Sep. 29, 1998

[54] SEMICONDUCTOR CIRCUIT AND SEMICONDUCTOR CIRCUIT DEVICE

[75] Inventor: Hirotsugu Matsumoto, Tokyo, Japan

[73] Assignee: Mitsubishi Denki Kabsuhiki Kaisha, Tokyo, Japan

[21] Appl. No.: 897,036

[22] Filed: Jul. 18, 1997

Related U.S. Application Data

[63] Continuation of Ser. No. 572,023, Dec. 14, 1995, abandoned.

[30] Foreign Application Priority Data

Aug. 10, 1995 [JP] Japan .................................. 7-204793

[51] Int. Cl.⁶ ..................................................... G05F 3/02
[52] U.S. Cl. ......................... 327/546; 327/408; 327/537; 327/545
[58] Field of Search .................................. 327/407, 408, 327/534, 537, 545, 546

[56] References Cited

FOREIGN PATENT DOCUMENTS 6-21443A 1/1994 Japan .

*Primary Examiner*—Terry Cunningham
*Attorney, Agent, or Firm*—Burns, Doane, Swecker & Mathis, LLP

[57] ABSTRACT

A semiconductor circuit is so constructed that one of a plurality of different potentials is supplied to sources of FETs via a switching circuit, so as to vary the threshold voltage of the FETs in accordance with the operating state of the semiconductor circuit, thereby decreasing the waste of power.

10 Claims, 3 Drawing Sheets

※ POTENTIAL APPLIED TO SUBSTRATE=0V

SEMICONDUCTOR CIRCUIT AND SEMICONDUCTOR CIRCUIT DEVICE

This application is a continuation, of application Ser. No. 08/572,023 filed Dec. 14, 1995 now abandoned.

BACKGROUND OF THE INVENTION

1. Field of the Invention

The present invention relates to an improvement for decreasing power consumption during a stand-by time in a semiconductor circuit and a semiconductor circuit device using a field effect transistor (hereinafter referred to as a FET) such as a metal-oxide-semiconductor FET (hereinafter referred to as a MOSFET).

2. Description of Related Art

Recently, techniques for reducing power consumption for use in a design of a CMOS integrated circuit have attracted attention because of an exoergic problem caused by a rapid operation of a device and the development of portable equipment.

With regard to the exoergic problem caused by a rapid operation of a device, as the operation frequency of the device is higher, power consumption is increased, resulting in increasing an amount of heat. Therefore, a countermeasure against the exoergic problem by radiation or cooling is required, which increases the production cost of the device. When the power consumption can be decreased, there is no need to provide such a countermeasure against the exoergic problem, and the production cost of the device can be decreased.

As to the development of portable equipment, various types of portable equipment are now widely used, whose power supplies are batteries. When power consumption of such equipment can be decreased, lifetime of the batteries can be increased. When there is no need to increase the lifetime, the volume of the batteries can be decreased, thereby decreasing the size of the equipment.

Under these circumstances, a technique for decreasing power consumption is significant.

The technique for decreasing power consumption can be attained by a variety of methods, among which decrease of a supply voltage is one of the most effective methods.

When a supply voltage is decreased, the switching speed of a MOSFET is decreased. In order to compensate the decrease of the switching speed, a threshold voltage Vth is decreased. A conventional device with a supply voltage of approximately 5 V has a threshold voltage Vth of approximately 0.7 V, and a device with a supply voltage of approximately 1.8 V has a threshold voltage Vth of approximately 0.4 V.

However, when the threshold voltage is decreased, a leak current caused when the MOSFET is off is increased, thereby causing another problem that a current flowing in a circuit including the MOSFET during a stand-by time is increased. In order to overcome this problem, Japanese Patent Application Laid-Open No. 6-21443 (1994) discloses a semiconductor circuit in which a back gate potential is switched depending upon whether a circuit including a MOSFET is in the operating state or the stand-by state. The present invention proposes another type of a semiconductor circuit for overcoming the problem.

SUMMARY OF THE INVENTION

The present invention has been devised to overcome the aforementioned problems, and one objective thereof is reducing a leak current caused during a stand-by time of a semiconductor circuit so as to decrease power consumption.

The semiconductor circuit of the invention comprises a functional block comprising at least one FET device, a plurality of potential supply means for respectively supplying a plurality of different potentials to be supplied to a source of the FET device, and switching means interposed between the source of the FET device and the potential supply means for supplying one of the different potentials to the source of the FET.

In one aspect of the invention, the switching means is characterized by supplying one of the potentials to the source in accordance with the operating state of the semiconductor circuit.

In another aspect of the invention, one of the potentials supplied by the potential supply means is an intermediate potential between a potential to be supplied to a back gate of the FET device and a power supply potential.

In still another aspect of the invention, the FET device is a MOSFET.

Therefore, in the case where the FET device in this semiconductor circuit is formed to have a small threshold value, the switching means switches the source potential of the FET, so that the power consumption is decreased during the operation of the semiconductor circuit and that a threshold voltage is increased during the stand-by time, thereby decreasing a leak current during the stand-by time.

Another object of the invention is reducing power consumption of a semiconductor circuit device including a plurality of semiconductor circuits.

The semiconductor circuit device of the invention comprises a plurality of the above-described semiconductor circuits. Therefore, in each of the semiconductor circuits, the switching means switches the source potential of the FET in accordance with the operating state of each semiconductor, so that the threshold voltage in each semiconductor circuit is increased during the stand-by time, thereby decreasing a leak current caused during the stand-by time.

The above and further objects and features of the invention will more fully be apparent from the following detailed description with accompanying drawings.

DESCRIPTION OF THE PREFERRED EMBODIMENTS

The present invention will now be described referring to the accompanying drawings.

Figure 1:
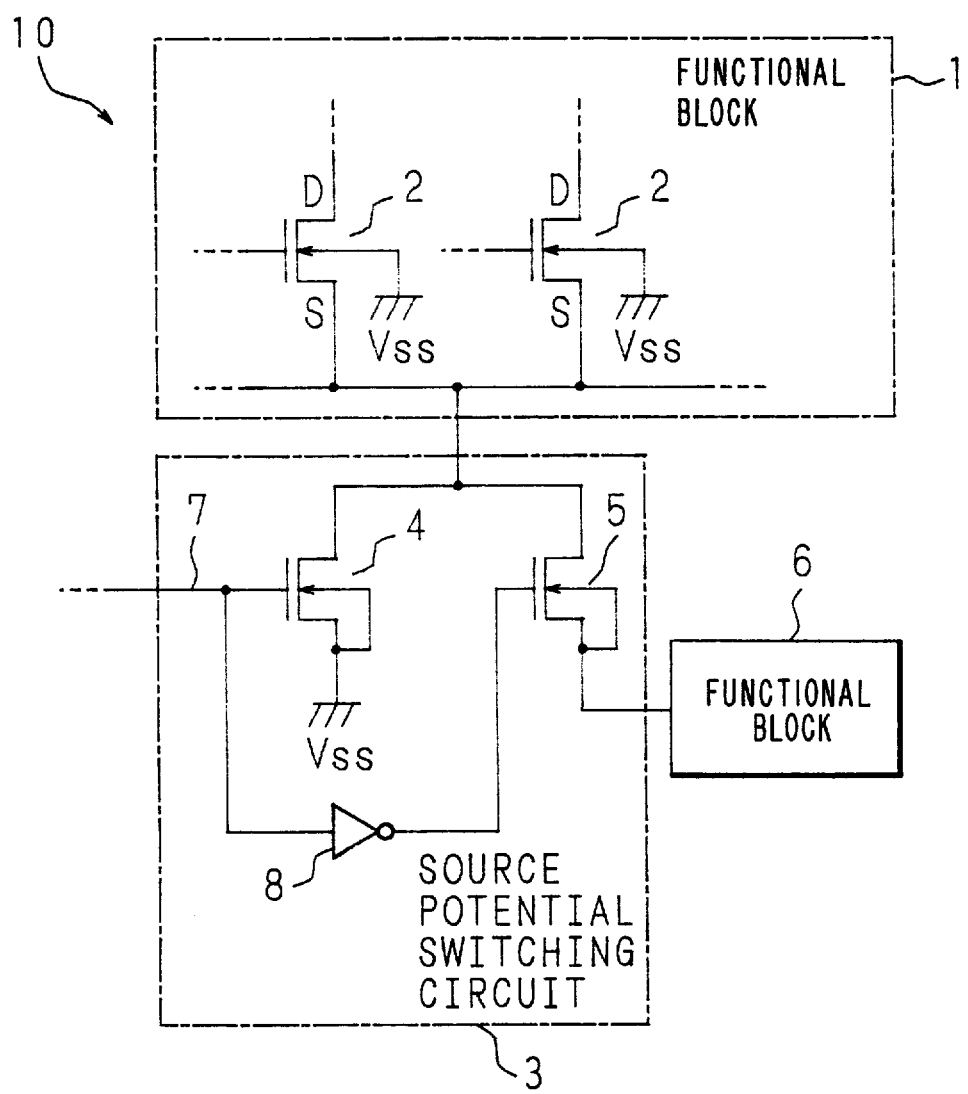
FIG. 1 is a block diagram showing an exemplified configuration of a main part of a semiconductor circuit of the invention.

FIG. 1 is a block diagram showing an exemplified configuration of a main part of a semiconductor circuit of the invention. A semiconductor circuit 10 comprises a functional block 1 having a predetermined function and a source potential switching circuit 3 for collectively switching the source potential of a plurality of MOSFETs included in the functional block 1. The plural MOSFETs in the functional block 1 include a plurality of N-channel type FETs 2.

The source potential switching circuit 3 comprises an input line 7 supplied with a source potential switching signal, N-channel type FETs 4 and 5, and an inverter 8. The input line 7 is connected to the gate of the N-channel type FET 4 and to the gate of the N-channel type FET 5 via the inverter 8. The N-channel type FET 4 is also connected to a ground terminal at its source and back gate, and the ground terminal is supplied with a ground potential Vss. The N-channel type FET 5 is also connected to an output line of a potential fixing circuit 6 at its source and back gate.

The N-channel type FETs 4 and 5 switch the source potential of the MOSFETs in the functional block 1 between the ground potential Vss and the fixed potential of the potential fixing circuit 6 in accordance with the content of a source potential switching signal.

An output potential Vb of the potential fixing circuit 6 is an intermediate potential between a supply voltage Vcc and the potential Vss (=0 V) of the ground terminal (i.e., Vcc>Vb>Vss). The potential fixing circuit 6 can be constructed of, for example, a voltage follower circuit using an OP amplifier or a reference potential generation circuit using voltage decrease of a diode.

The drains of the N-channel type FETs 4 and 5 are connected to each other, and the connection line therebetween is connected to the functional block 1.

The functional block 1 comprises the plural N-channel type FETs 2 whose sources S are connected to one another, whose back gates are connected to ground terminals each supplied with a ground potential Vss, and whose gates are connected to respective input signal lines. The sources S of the N-channel type FETs 2 are connected to the connection line connecting the drains of the N-channel type FETs 4 and 5.

Although FIG. 1 shows the N-channel type FETs 2 alone in the functional block 1, the drains of the N-channel type FETs 2 are actually connected to elements serving as loads (for example, the FETs 2 are connected to the drains of P-channel type FETs when the functional block is a CMOS circuit).

In this semiconductor circuit 10, when the functional block 1 is operated, the input line 7 of the source potential switching circuit 3 is supplied with a source potential switching signal at a high level. In this case, the N-channel type FET 4 is on and the N-channel type FET 5 is off, and hence, the sources of the N-channel type FETs 2 in the functional block 1 are supplied with the ground potential Vss.

In this case, the N-channel type FETs 2 can be operated at a low supply voltage (for example, approximately 1.8 V) as far as the threshold voltage Vth thereof is set to be lower than 0.7 V (for example, approximately 0.4 V), which is the threshold voltage obtained when the supply voltage is approximately 5 V.

When the functional block 1 is in the stand-by state, the input line 7 of the source potential switching circuit 3 is supplied with a source potential switching signal at a low level. In this case, the N-channel type FET 4 is off and the N-channel type FET 5 is on, and hence, the sources of the N-channel type FETs 2 in the functional block 1 are supplied with the output potential Vb of the potential fixing circuit 6.

Since a potential Vss (=0 V) of the ground terminal is applied to the substrate (back gate) of each N-channel type FET 2 in the functional block 1, the threshold voltage Vth is increased owing to a back gate effect, thereby decreasing a leak current in the N-channel type FETs 2 which are off.

Figure 2:
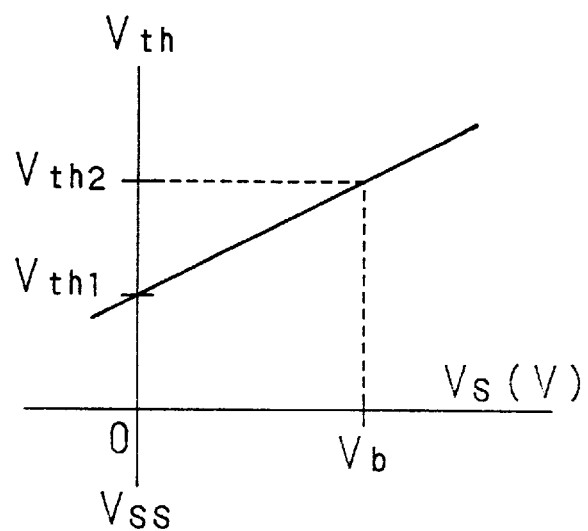
FIG. 2 is an explanatory diagram showing a relationship between a source potential Vs and a threshold voltage Vth in a typical N-channel type FET included in a functional block.

FIG. 2 shows a relationship between the source potential Vs and the threshold voltage Vth of the N-channel type FET 2 included in the functional block 1. In the stand-by state of the functional block 1, the threshold voltage Vth is $Vth_2$ when the source potential Vs is Vb. In the operating state of the functional block 1, the threshold voltage Vth is Vth, when the source potential Vs is Vss. In this manner, the threshold voltage Vth is higher when the functional block 1 is in the stand-by state, resulting in decreasing a leak current during the stand-by time.

A source potential switching signal supplied to the input line 7 of the source potential switching circuit 3 is controlled by, for example, the content of a register of one bit (not shown). The content of the register is set/reset by software or hardware.

When the content of the register is set/reset by software, for example, the register is provided in an address space in a microcomputer (not shown), so that the content of the register is freely overwritten.

When the content of the register is set/reset by hardware, for example, a clock of the functional block 1 is monitored, and the content of the register is changed to be at a low level when the clock is halted.

Although the description is made in this embodiment by exemplifying the functional block 1 including the N-channel FETs 2, a leak current during the stand-by time can be further decreased by another configuration. For example, when the functional block 1 is constructed of a CMOS circuit, an additional source potential switching circuit 3 (whereas including P-channel type FETs) is disposed to be connected to the sources of P-channel type FETs in the CMOS circuit.

Figure 3:
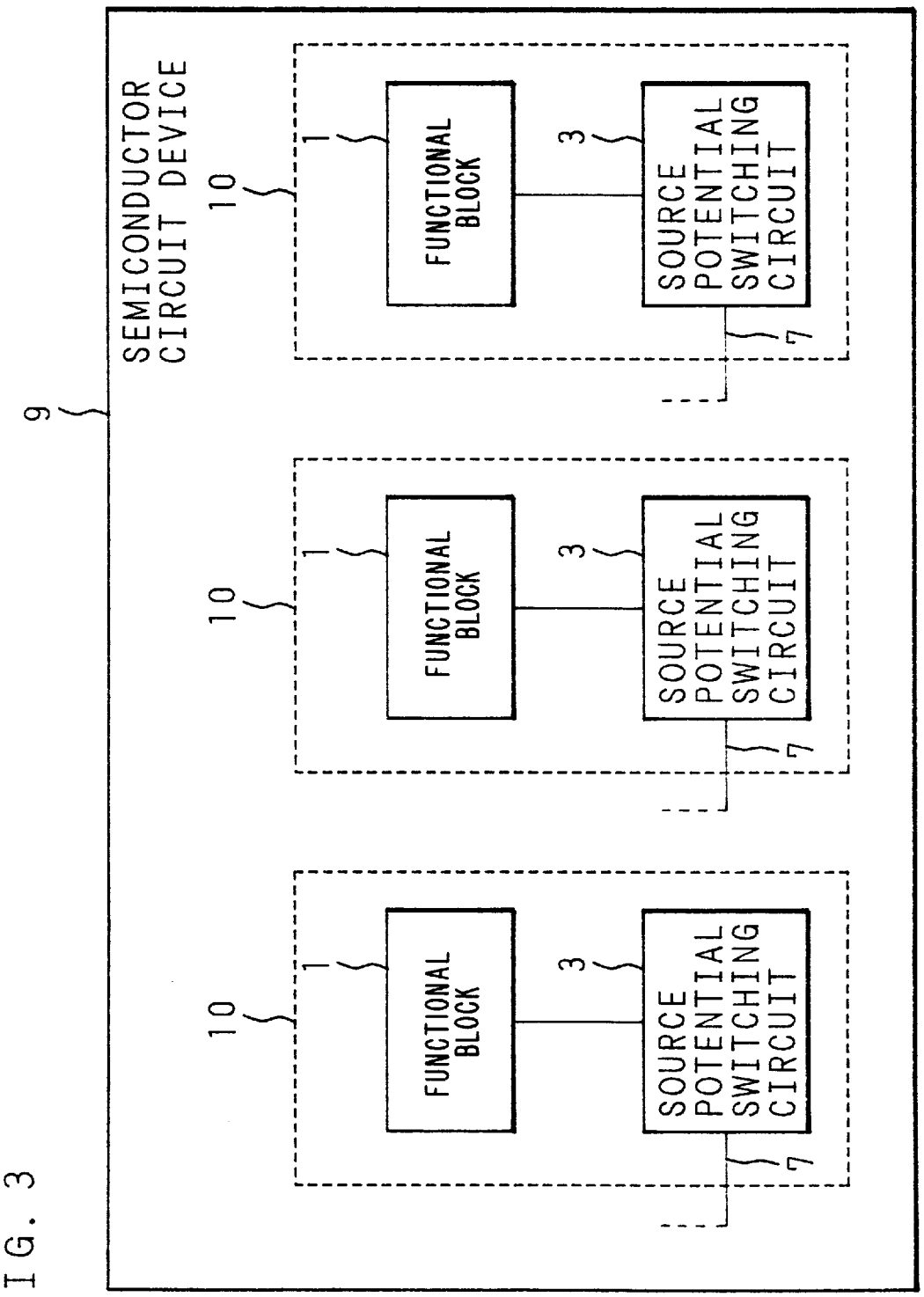
FIG. 3 is a block diagram showing an exemplified configuration of a main part of a semiconductor circuit device of the invention.

FIG. 3 is a block diagram showing an exemplified configuration of a main part of a semiconductor circuit device of the invention. This semiconductor circuit device 9 constructed of MOSFETs comprises a plurality of semiconductor circuits 10. Each of the semiconductor circuits 10 comprises a functional block 1 having a predetermined function, a source potential switching circuit 3 for collectively switching the source potential of a plurality of MOSFETs in the functional block 1, and a potential fixing circuit. The potential fixing circuit is not shown in FIG. 3 and can be provided to each potential switching circuit 3 or commonly provided to all of the potential switching circuits 3. The functions of the functional blocks 1 in the respective semiconductor circuits 10 can be different from one another. The source potential switching circuit 3 has the same configuration as described above referring to FIG. 1, and hence, the description is omitted.

In this semiconductor circuit device 9, the input line 7 of each source potential switching circuit 3 corresponding to each functional block 1 is selectively supplied with a source potential switching signal at a high/low level. Therefore, the MOSFETs in the functional block 1 can be operated at a low supply voltage, and a leak current in the MOSFETs in the functional block 1 can be decreased.

In this case, a source potential switching signal supplied to the input line 7 of each source potential switching circuit 3 corresponding to each functional block 1 can be selectively controlled by software or hardware. The remaining operation is conducted similarly to the operation of the semiconductor circuit described above, and hence, the description is omitted.

In the semiconductor circuit of the invention, the threshold voltage of a MOSFET is decreased so that the MOSFET can be operated at a low voltage, and the source potential of the MOSFET is changed depending upon the operating state of the semiconductor circuit. As a result, a leak current during the stand-by time can be decreased.

In the semiconductor circuit device of the invention, since a leak current during the stand-by time in each of the semiconductor circuits included in the semiconductor circuit device can be decreased, the power consumption can be further decreased.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor circuit for decreasing power consumption, comprising:

a functional block including at least one FET having source and drain electrodes, one of which is downstream of current flowing through said at least one FET and the other is upstream of said current when operational;

potential supply means for supplying one of a first potential and a second potential to said electrode which is downstream of said current of the at least one FET;

switching means, connected to said electrode which is downstream of said current of the at least one FET and the potential supply means, for supplying said electrode which is downstream of said current of the at least one FET with one of the first and second potentials supplied by the potential supply means; and an input line connected to said switching means for selecting said one of the first and second potentials, said first potential being used when said at least one FET device is in an operational state and said second potential being used when said at least one FET device is in a stand-by state, said second potential being larger in magnitude than said first potential.

2. The semiconductor circuit according to claim 1, wherein said second potential supplied by the potential supply means is an intermediate potential between a potential supplied to a back gate of the at least one FET and a higher potential supplied to the other electrode which is upstream of said current of said at least one FET.

3. The semiconductor circuit according to claim 1, wherein said potential supply means comprises a first voltage supply for supplying said first potential and a second voltage supply for supplying said second potential, and wherein said switching means further comprises:

a first transistor connected to said first voltage supply; and a second transistor connected to said second voltage supply.

4. The semiconductor circuit according to claim 3, wherein:

said first transistor further includes a source connected to said first voltage supply, a gate connected to said input line, and a drain connected to said electrode which is downstream of said current of said at least one FET; and said second transistor further includes a source connected to said second voltage supply, a gate connected to said input line via an inverter, and a drain connected to said electrode which is downstream of said current of said at least one FET.

5. The semiconductor circuit of claim 3, wherein:

said at least one FET includes a back gate connected to said first voltage supply.

6. A semiconductor circuit device for decreasing power consumption, comprising:

a plurality of semiconductor circuits, each of the semiconductor circuits including:

a functional block including at least one FET having source and drain electrodes, one of which is downstream of current flowing through said at least one FET and the other is upstream of said current when operational;

potential, supply means for supplying one of a first potential and a second potential to said electrode which is downstream of said current of the at least one FET;

switching means, connected to said electrode which is downstream of said current of the at least one FET and the potential supply means, for supplying said electrode which is downstream of said current of the at least one FET with one of the first and second potentials supplied by the potential supply means; and an input line connected to said switching means for selecting said one of the first and second potentials, said first potential being used when said at least one FET device is in an operational state and said second potential being used when said at least one FET device is in a stand-by state, said second potential being larger in magnitude than said first potential.

7. The semiconductor circuit device according to claim 5, wherein, for each of said semiconductor circuits, said second potential supplied by the potential supply means is an intermediate potential between a potential supplied to a back gate of the at least one FET and a higher potential supplied to the other electrode which is upstream of said current of said at least one FET.

8. The semiconductor circuit device according to claim 6, wherein, for each of said semiconductor circuits, said potential supply means comprises a first voltage supply for supplying said first potential and a second voltage supply for supplying said second potential, and wherein said switching means further comprises:

a first transistor connected to said first voltage supply; and a second transistor connected to said second voltage supply.

9. The semiconductor circuit device according to claim 8, wherein, for each of said semiconductor circuits:

said first transistor further includes a source connected to said first voltage supply, a gate connected to said input line, and a drain connected to said electrode which is downstream of said current of said at least one FET; and said second transistor further includes a source connected to said second voltage supply, a gate connected to said input line via an inverter, and a drain connected to said electrode which is downstream of said current of said at least one FET.

10. The semiconductor circuit device of claim 8, wherein, for each of said semiconductor circuits:

said at least one FET includes a back gate connected to said first voltage supply.

* * * * *